United States Patent [19]

Benedikt

[11] Patent Number: 4,910,077

[45] Date of Patent: Mar. 20, 1990

[54] POLYNORBORNENE LAMINATES AND METHOD OF MAKING THE SAME

[75] Inventor: George M. Benedikt, Macedonia, Ohio

[73] Assignee: B.F. Goodrich Company, Akron, Ohio

[21] Appl. No.: 228,034

[22] Filed: Aug. 4, 1988

[51] Int. Cl.$^4$ .............................................. B32B 7/00
[52] U.S. Cl. ...................................... 428/251; 29/830; 156/307.5; 156/310; 156/326; 174/256; 428/623; 428/626; 428/901
[58] Field of Search ...................... 156/310, 326, 307.5; 428/623, 251, 626, 901; 174/68.5; 29/830; 524/553

[56] References Cited

U.S. PATENT DOCUMENTS

| | | | |
|---|---|---|---|
| 3,360,349 | 12/1967 | Afomines | 428/626 |
| 3,508,983 | 4/1970 | Origer et al. | 428/901 |
| 3,558,423 | 1/1971 | Rossetti, Jr. | |
| 3,644,166 | 2/1972 | Gause | 428/251 |
| 4,136,247 | 1/1979 | Tenney et al. | |
| 4,178,424 | 12/1979 | Tenney et al. | |
| 4,315,970 | 2/1982 | McGee | |
| 4,639,285 | 1/1987 | Suzuki et al. | |

OTHER PUBLICATIONS

Chemical Abstract No. 107:97841p, "Polycyclic Olefin Laminated Boards", Japanese Kokai JP 62,296,046.
Chemical Abstract No. 107:8574p, "Epoxy Prepregs for Printed-Wiring Boards", Japanese Kokai JP 61,283,628.
Chemical Abstract No. 107:8575q, "Epoxy Prepregs for Printed Wiring Boards", Japanese Kokai JP 61,283,627.
Chemical Abstract No. 98:1602024m, "Metal-Covered Laminates", Japanese Kokai JP 57,188,349.
Chemical Abstract No. 98:162025n, "Metal Covered Laminates", Japanese Kokai JP 57,188,347.
Chemical Abstract No. 98:162026p, "Metal-Covered Laminates", Japanese Kokai JP 57,188,347.
WPI No. 83-00996K/01 (JP 8173892).
WPI No. 83-759725/DE3208198, dated 9/8/83.
WPI No. 74-34559V/19, priority dated U.S. 303369 and U.S. 747071, filed Nov. 3, 1972 and Dec. 2, 1976.
WPI No. 85-162927/27, JP 60-094348, date 5/27/85.
CMOS Cookbook, Second Edition, Don Lancaster, pp. 32-34.
Butler et al., "Some Approaches to Low Dielectric Constant Matrix Resins for Printed Circuit Boards", 15th National SAMPE Technical Conference, Oct. 4-6, 1983, pp. 660-669.

Primary Examiner—John J. Gallagher
Attorney, Agent, or Firm—Frank E. Robbins; Richard J. Traverso

[57] ABSTRACT

Printed wiring boards useful for high frequency applications are obtained by laminating a copper foil pretreated with a silane to a polynorbornene prepreg. The prepreg is made by impregnating a fiberglass cloth with a ring-opening polymerized polymer. The copper foil is pretreated with a silane which is capable of improving the bond strength between the copper foil and a norbornene copolymer.

19 Claims, No Drawings

POLYNORBORNENE LAMINATES AND METHOD OF MAKING THE SAME

BACKGROUND OF THE INVENTION

The present invention relates to printed circuit wiring boards composed of a polynorbornene substrate laminated to a copper foil using silane coupling agents.

The purpose of the present invention is to produce printed circuit wire boards which have a low dielectric constant and high bonding strength.

Such laminates are generally compared in the market place for dielectric constant, dissipation factor, chemical resistance, peel strength, solder bath resistance (at 260° C. to 288° C.), warping and punchability.

In conventional processes, so called "prepregs" are made by dipping a pretreated fibrous substrate (fiberglass) in Epoxy or some other solution of polymer resin having good strength and electrical insulating properties and drying the fibrous substrate to remove the solvent and provide a resin-impregnated substrate. It is known to treat the glass substrate with a silane compound to promote the adhesion between the substrate and the resin.

Cellulosic and fiberglass woven materials have long been used to reinforce polymer substrates. It is known silane coupling agents can be applied directly to glass filaments to improve the flexural strength of glass cloth laminates of a variety of resins, often by as much as 300 percent for compression molded test samples. Silane coupling agents at the interface allow many particulate minerals to become reinforcing fillers in composites to increase strength, hardness, modulus, heat distortion and impact strength. Fiberglass cloth is usually treated with an aqueous coupling agent.

Two or more of these prepregs are then pressed together to form an insulating layer for a printed circuit wiring board. To provide the conducting layer for the laminate, one or more copper layers are generally pressed against the exposed surfaces of these prepregs.

Other methods of applying metals to these insulating layers or substrates are vapor deposition, electroplating, sputtering, ion plating, spraying and layering. The metals commonly used are copper, nickel, tin, silver solder, gold, aluminum, platinum, titanium, zinc and chrome, with copper being used most often in printed wire boards.

A problem associated with forming thin metallic coatings on insulating layers or substrates has been the inability to form a complete bond having excellent bond strength between the metallic layer and the substrate and subsequently good solder resistance.

Silane compounds have found wide acceptability for improving adhesion between different substrates.

Silane coupling agents modify the interface between metal or mineral surfaces and organic resins to improve adhesion between the surface and the resin. The physical properties and water resistance of the reinforced resins are thereby improved. It is believed that silane coupling agents for bonds with metal surfaces through the silane functional group. The hydrolyzed silanes will condense to oligomeric siloxanols and eventually to rigid cross-linked structures. Contact with a polymer matrix should take place while the siloxanols still have some solubility. Bonding to a polymer matrix may take different forms or a combination of forms. Bonding may be covalent where the oligomeric siloxaol is compatible with the liquid matrix resin. The solutions might also form an interpenetrating polymer network as the siloxanols and the resin separately cure with only limited copolymerization.

It is well known that not all silanes or mixtures of silanes will bond all metals to all substrates. McGee, U.S. Pat. No. 4,315,970, states that "[i]t is generally accepted that specific silanes can be used for adhesion of specific materials to specific substrates. That is, the silane must be matched to the application and it cannot be assumed that all silanes will work in all applications."

Therefore, the suitability of a silane bonding agent in improving adhesion of a metal to a substrate is unpredictable and it must be determined by experimentation.

While suitable coupling agents are commercially available for bonding of many common plastics with a variety of metals, the application of silane coupling agents for bonding of polynorbornenes to metals is not believed by applicant to be previously known.

Norbornene type monomers are polymerized by either a ring-opening mechanism or by an addition reaction wherein the cyclic ring structure remains intact. Ring-opening polymerizations are discussed with greater particularity in U.S. Pat. Nos. 4,136,247 and 4,178,424, assigned to the same assignee as the present invention and are incorporated herein by reference for their discussion of such polymerizations. Ring-opening polymerization generally yields unsaturated linear polymers while addition polymerizaton yields polycycloaliphatics. It is desirable to produce polymers having high molecular weight monomers incorporated therein to provide good temperature resistance, i.e., high heat distortion temperatures and high glass transition temperatures.

SUMMARY OF THE INVENTION

Printed wiring boards use mainly for high frequency applications are disclosed. Printed wiring boards of the present invention are comprised of a polynorbornene core laminated to a copper foil. It has been found that when copper foil of the type generally used for printed wiring boards is pretreated with certain silane compounds and then laminated to a prepreg core of polynorbornene copolymer at temperatures above the glass transition (Tg) temperature of the polymer, a printed wiring board having improved adhesion, solvent resistance and resistance to blistering is obtained.

The prepregs are produced from a solution of polymers obtained from polymerization of norbornene type monomers with a variety of compounds. To provide the prepregs, a non-cellulosic cloth is impregnated with the polymer solution and allowed to dry until the solvent content is about 2.5% by weight or below. Preferably this cloth is pretreated with silane coupling agent. The copper foil is pretreated with a silane compound that has been found to be useful as a coupling agent between polynorbornene and the foil. This copper foil is typically about 35 microns thick and has a dendritic bronze surface. One or more of the prepregs are stacked between two copper foils and lamination is carried out at up to 1,100 psi and up to 250° C.

The resulting printed wiring board shows improved peel strength of at least about 6 pounds/inch, preferably between 6 and 15 pounds per inch of width for a ½" wide strip when measured at a pull angle of 180 degrees. These printed wire boards have a dielectric constant below 3.5, preferably below 3.1, and a dissipation factor below 0.005, preferably below 0.003, at 1 MHZ when the ratio of polymer to reinforcing support ranges from about 40:60 to about 80:20 with E-type fiberglass as the support and from about 30:70 to about 80:20 when the reinforcing support has a lower dielectric constant than E-glass.

These printed wire boards show low solvent swellings at room temperature in methylene chloride of less than 40%, preferably less than 25% and even more preferably less than 15% in a 60 mil thick sample. They have a coefficient of thermal expansion normal to the plane of the board surface preferably below 80 ppm/° C. The laminates are preferably resistant to the thermal stress in a solder bath at 260° C. for at least 20 seconds without copper delamination or blistering.

DETAILED DESCRIPTION OF THE INVENTION

The present invention provides laminates such as printed wire boards having superior dielectric properties by laminating a substrate layer, such as one or more prepregs of fiberglass reinforced polynorbornene polymer to a copper foil utilizing a silane coupling agent.

In the present invention, these prepregs are derived from a polynorbornene dipping solution. This polynorbornene dipping solution comprises solubilized polynorbornene polymers. These polymers are obtained from the metathesis ring-opening polymerization of cycloolefin monomers having a norbornene functional group.

These cycloolefin monomers are characterized by the presence of at least one norbornene moiety in its structure identified below:

Suitable cycloolefin monomers include substituted and unsubstituted norbornenes, dicyclopentadienes, diydrodicyclopentadienes, trimer of cyolopentadiene, tetracyclododecenes, hexacycloheptadecenes, ethylidenyl norbornenes and vinylnorbornenes. Substituents on the cycloolefin monomers include hydrogen, alkyl, alkenyl, and aryl groups of 1 to 20 carbon atoms, and saturated and unsaturated cyclic groups of 3 to 12 carbon atoms which can be formed with one or more, preferably two, ring carbon atoms. In a preferred embodiment, the substituents are selected from hydrogen and alkyl groups of 1 to 2 carbon atoms. Generally speaking, the substituents on the cycloolefin monomers can be any which do not poison or deactivate the polymerization catalyst.

Examples of the preferred monomers referred to herein include
dicyclopentadiene,
methyltetracyclododecene,
2-norbornene,
and other norbornene monomers such as
5-methyl-2-norbornene,
5,6-dimethyl-2-norbornene,
5-ethyl-2-norbornene,
5-ethylidenyl-2-norbornene (or 5-ethylidene-norbornene),
5-butyl-2-norbornene,
5-hexyl-2-norbornene,
5-octyl-2-norbornene,
5-phenyl-2-norbornene,
5-dodecyl-2-norbornene,
5-isobutyl-2-norbornene,
5-octadecyl-2-norbornene
5-isopropyl-2-norbornene,
5-phenyl-2-norbornene,
5-p-toluyl-2-norbornene,
5-α-naphthyl-2-norbornene,
5-cyclohexyl-2-norbornene,
5-isopropenyl-norbornene,
5-vinyl-norbornene,
5,5-dimethyl-2-norbornene,
tricyclopentadiene (or cyclopentadiene trimer),
tetracyclopentadiene (or cyclopentadiene tetramer),
dihydrodicyclopentadiene (or cyclopentene-cyclopentadiene co-dimer),
methyl - cyclopentadiene dimer,
ethyl - cyclopentadiene dimer,
tetracyclododecene
9-methyl-tetracyclo[6,2,1,1$^{3,6}$,0$^{2,7}$]dodecene-4, (or methyl-tetracyclododecene)
9-ethyl-tetracyclo[6,2,1,1$^{3,6}$,0$^{2,7}$]dodecene-4, (or ethyl-tetracyclododecene)
9-propyl-tetracyclo[6,2,1,1$^{3,6}$,0$^{2,7}$]dodecene-4,
9-hexyl-tetracyclo[6,2,1,1$^{3,6}$,0$^{2,7}$]dodecene-4,
9-decyl-tetracyclo[6,2,1,1$^{3,6}$,0$^{2,7}$]dodecene-4,
9,10-dimethyl-tetracyclo[6,2,1,1$^{3,6}$,0$^{2,7}$]dodecene-4,
9-methyl,10-ethyl-tetracyclo[6,2,1,1$^{3,6}$,0$^{2,7}$]dodecene-4,
9-cyclohexyl-tetracyclo[6,2,1,1$^{3,6}$,0$^{2,7}$]dodecene-4,
9-chloro-tetracyclo[6,2,1,1$^{3,6}$,0$^{2,7}$]dodecene-4,
9-bromo-tetracyclo[6,2,1,1$^{3,6}$,0$^{2,7}$]dodecene-4,
9-fluoro-tetracyclo[6,2,1,1$^{3,6}$,0$^{2,7}$]dodecene-4,
9-isobutyl-tetracyclo[6,2,1,1$^{3,6}$,0$^{2,7}$]dodecene-4,
9,10-dichloro-tetracyclo [6,2,1,1$^{3,6}$,0$^{2,7}$]dodecene-4.

This invention especially contemplates the use of one or more of the following monomers so as to provide both homopolymers and copolymers upon polymerization. Copolymers are defined as polymers composed of two or more monomers:
norbornene,
5-vinyl-norbornene,
methylnorbornene,
tetracyclododecene,
methyltetracyclododecene,
dicyclopentadiene,
5-ethylidenyl-2-norbornene,
hexacycloheptadecene, and
tricyclopentadiene.

Other monomers can form part of the polynorbornenes such as non-conjugated acyclic olefins, monocyclic olefins and diolefins. The non-conjugated acyclic olefins act as chain terminators. Hexene-1 is preferred while 1-butene, 2-pentene, 4-methyl-2-pentene, and 5-ethyl-3-octene are suitable also. They are typically used at a molar ratio of 0.001:1 to 0.5:1 acyclic olefin to cyclollefin monomer.

The polynorbornenes used in forming the printed wire boards of the present invention are obtained by solution polymerization. For solution polymerization, the catalyst preferably comprises molybdenum or tungsten salts and the co-catalyst preferably comprises dialkylaluminum halides, alkylaluminum dihalides, alkylalkoxy halide or a mixture of trialkylaluminum with an iodine source.

Examples of useful molybdenum and tungsten salts include the halides such as chlorides, bromides, iodides, and fluorides. Specific examples of such halides include molybdenum pentachloride, molybdenum hexachloride, molybdenum pentabromide, molybdenum hexabromide, molybdenum pentaiodide, molybdenum hexafluoride, tungsten hexachloride, tungsten hexafluoride and the like. Other representative salts include those of acetylacetonates, sulfates, phosphates, nitrates, and the like. Mixtures of salts can also be used. For polymerization results, the more preferred salts are the molybdenum halides, especially molybdenum pentahalides such as $MoCl_5$.

Specific examples of co-catalysts for ring-opening solution polymerization include alyl-aluminum halides such as ethylaluminum sesquichloride, diethylaluminum chloride, ddiethylaluminum iodide, ethylaluminum diiodide, propylaluminum diiodide and ethylpropylaluminum iodide and a mixture of triethylaluminum and elemental iodine.

For solution polymerization, the molybdenum or tungsten salt is generally employed at a level from about 0.01 to about 50 millimoles per mole of total monomer, preferably from about 0.5 to about 10 millimoles per mole of total monomer and, the organoaluminum compounds described above are generally ssed in a molar ratio of organoaluminum compound to molybdenum and/or tungsten salt(s) from about 10/1 to about ½, preferably from about 5/1 to about 3/1. Both catalyst and co-catalyst for solution polymerization are normally added after the heating and at the time of polymerization.

Suitable solvents used for the solution polymerization and in forming the dipping solution include aliphatic and cycloaliphatic hydrocarbon solvents containing 4 to 10 carbon atoms such as cyclohexane, cyclooctane and the like; aromatic hydrocarbon solvents containing 6 to 14 carbon atoms which are liquid or easily liquified such as benzene, toluene, xylene and the like; and substituted hydrocarbons wherein the substituents are inert such as dichloromethane, chloroform, chlorobenzene, dichlorobenzene and the like. Optionally present within the dipping solution are curing agents which initiate radical crosslinking such as the peroxides, di-t-butyl peroxide, or 2,5-dimethyl-2,5-di(t-Butylperoxy)-hexyne-3. Antioxidants such as hindered phenol antioxidants (Ethyl 330) and polyunsaturated monomeric or oligomeric crosslinkers such as trimethylol propane triacrylate are also optional. The dipping solution has solids content of preferably about 10% to about 40%. Dipping solutions having concentrations both above and below this range can be used in forming the laminates of the invention.

The dipping solution is impregnated into a non-cellulosic cloth, such as fiberglass to form a substrate layer, often referred to as a prepreg. The cloth may be woven or non-woven. Many glass cloth materials having a variety of surface characteristics are available commercially. In the present invention E-type fiberglass cloth, style 2116, having a surface finish type 642 or 627 made by Burlington Industries is preferred. The glass cloth may be pretreated with a silane solution. A preferred class of pretreating agents is the styryl diamino silanes. This non-cellulosic cloth is impregnated by immersing it in the dipping solution of the polynorbornene diluted in an organic solvent. This can be accomplished at ambient temperatures or at the temperatures above or below ambient temperatures.

The prepreg so produced is typically dried at temperatures between ambient temperature and about 150° C. At the final stages of drying the temperature is preferably maintained above the glass transition temperature (Tg) of the polymer to permit the solvent to diffuse out. If curing agents are present, the temperature is kept sufficiently low to prevent activation of the radical crosslinking.

The laminates produced by the present invention incorporate a copper film with a copper surface layer, such as copper foil. This copper foil can be the surface layer of other metallic films. The copper surface layer is pretreated with a silane solution which increases the bond strength between the substrate and the copper surface layer. Preferably, copper foil of the type manufactured for printed wiring boards with a matte side for lamination to a prepreg is pretreated with such a solution of silane coupling agent before being laminated to the prepreg. Such copper foils are typically about 35 microns thick and have a dendritic bronze matte surface.

According to the present invention several silanes were found to be preferred for bonding substrate layers of polynorbornene impregnated glass to copper layers. The silane coupling agent is preferably in solution at concentrations ranging from about 1% to 10% by weight. Suitable silanes include:
3-methylacryloxypropyltrimethoxysilane,
styryl diamino silanes e.g. 3-(N-styrylmethyl-2-aminoethylamino)propyltrimethoxysilane hydrochloride,
3-(N-allyl-2-aminoethylamino)-propyltrimethoxy-silane hydrochloride,
N-(styrylmethyl)-3-aminopropyltrimethoxysilane hydrochloride,
N-2-aminoethyl-3-aminopropyltrimethoxysilane, and
3-(N-Benzyl-2-aminoethylamino)-propyltrimethoxy silane hydrochloride.

The laminates, such as printed wire boards are finished by laminating the pretreated copper layer to the substrate layer (prepreg). Lamination is accomplished in a heated press using pressures above about 700 psi, preferably above 1000-1100 psi and at temperatures between ambient temperature and 250° C., but preferably between 170° C. and 190° C. Preferably the temperature is above the glass transition temperature of the polynorbornene and sufficiently high to activate any peroxide curing agents. At such temperatures, any peroxide curing agent present in the polymer releases an oxygen free radical which causes crosslinking. Crosslinking provides strength and chemical resistance to the boards. Generally a stack of prepregs may be pressed between a pair of pretreated copper foils. The pretreated bronze side of the copper foil is placed in contact with the prepreg.

The following examples are provided to illustrate preferred embodiments of the present invention. They are not intended to limit the scope of this disclosure to the embodiments exemplified therein. All percentages are by weight unless specified otherwise.

EXAMPLE 1

Step 1

Preparation of 65/35 (wt/wt) Methyltetracyclododecene (MTD) Vinyl-Norbornene (VNB) Copolymer An unsaturate polynorbornene polymer was obtained in the following manner. Into a septum-capped vessel containing 30 g. of molecular sieves were added 81 g. of dry toluene, 10.22 g. of methyl tetracyclododecene, 5.73 g. vinyl norbornene and 4.90 g. hexene-1. The contents were mixed and this mixture was allowed to stand 30 minutes, then transferred to a second vessel by passing it through a 1 micron filter under nitrogen pressure. The vessel was slightly pressurized with nitrogen. To the mixture 0.23 cc of a 25% solution of ethylaluminum-sesquichloride (EASC cocatalyst) in dry toluene were introduced by syringe. To this mixture, 1.65 cc of a solution of 2 g. of molybdenum pentachloride catalyst in 39 g. of dry ethylacetate and 84 g. of dry toluene, were also introduced by syringe. Within one minute, an exothermic reaction of the mixture resulted and the mixture became a viscous liquid. After 15 minutes, 60 cc of a 88/12 (wt/wt) mixture of 2-propanol and water was added to the vessel and the contents shaken to inactivate the catalyst. The top layer containing mostly solvents, residual monomers add low molecular weight polymers has poured off. The semisolid bottom layer was redissolved in 100 cc of toluene, washed with water and dried by azeotropic distillation of part of the solvent.

Polymerization was found to be 91% conversion of monomer as calculated by measuring tee percent weight solids of the resulting polymer solution. The glass transition temperature (Tg) was found to be 118° C. in the second heat, as calculated from a Differential Scanning Calorimetry curve of a sample of the polymer that was diluted in toluene, precipitated into methanol with stirring, filtered and dried.

Step 2

Preparation of Prepreg

A dipping solution to obtain prepregs was obtained in the following manner. The polymer solution above was diluted with toluene to a viscosity of 500 cSt. an 3.5 phr of Lupersol 130 peroxide (Lupersol 130 is a trademark of Lucido division of Penwalt Corp.) were added, followed by 1 phr of Irganox 1010 antioxidant (Irganox 1010 is a trademark of Ciba-Geigy Co.). An E-type glass cloth, style 2116 having a 642 finish (product of Burlington Industries) was impregnated with dipping solution and dried at room temperature until it was tack-free. The resulting prppreg was then transferred to a mechanical convection oven where drying was continued at successively higher temperatures as follows:

| Degrees C. | Minutes |
| --- | --- |
| 50 | 15 |
| 75 | 15 |
| 100 | 20 |
| 130 | 10 |

The finished prepreg was 16 mils thick, contained 62% by weight polymer an less than 2.5% volatiles. The polymer was found to be still soluble in toluene.

Step 3

Pretreatment of Copper Foil with a Silane

A commercially available electrodeposited copper foil (product of Gould, Inc.) typically used for fabricating general purpose epoxy prined wiring boards was prepared for laminating to the prepreg. The foil, as purchased, weighed 1 oz. per ft.$^2$, was 35 microns thick and had a roughened matt bronze surface on one side. The treatment method used to roughen the surface is proprietary to Gould, Inc. It is not expected that this treatment method is essential to perform this invention; however, such copper foils are preferred.

The copper foil was dipped in a 10% solution of 3-methacryloxypropyltrimethoxysilane (a product of Petrarch Systems, Inc.) in methanol for 30 minutes and was allowed to air dry at room temperature for 15 minutes, then transferred to an oven where drying was completed at 105° C. for 5 minutes.

Step 4

Lamination of Copper Foil to the Prepreg

Two plies of prepregs were laminated between copper foil at from 180° C. to 220° C. and 1,000 pounds pressure per square inch for 30 minutes to provide a 6" by 6" laminate. The increase in temperature was gradual at about 2 degrees per minute.

Results

Strength of Copper Foil Adhesion to Polymer-Glass Core

Peel strength at 180 degrees was measured and found to be 8.0 lbs/in. Peel strength at 180 degrees is a measurement of the adhesion strength of ½" strips of copper foil that remain after etching. This is measured by the force necessary to remove the ½" copper strips when pulled at an angle of 180 degrees from the strip direction in the plane of the wire board. A number of strips are tested and the highest value for peel strength is reported.

Solder bath resistance for 20 seconds, was not determined. Solder bath resistance is the resistance of the laminate to blistering, a reflection of uneven adhesion, when immersed in a molten solder bath at either 260° C. or 288° C. for 20 seconds.

These tests are at least equivalent to the ASTM D 1867-82 and Military Specification MIL-P-13949F standard tests of 90 degree peel strength and 288° C. solder bath resistance for 10 seconds.

Electrical Resistance Properties

The wire board showed a dielectric constant at 1 MHz of about 3.05 and a dissipation factor of about 0.003.

EXAMPLE 2

Example 1 was repeated except that the copper foil was dipped in a 5% solution of 3-methacryloxypropyl-trimethoxysilane in methanol for 30 minutes. A 2-ply laminate 6"×6" was obtained from a prepreg (2-ply) at 11.78 g and 58.2% polymer uptake.

Results

The peel strength of the resulting wire board at 180 degrees was 8.2 lbs/in. The board failed the solder bath resistance test at 260° C. for 20 seconds.

EXAMPLE 3

Example 1 was repeated except that in step 3 the copper foil was dipped in a solution of 0.4% 3-(N-styrylmethyl-2-aminoethylamino)-propyltrimethoxysilane hydrochloride (a product of Petrarch Systems, Inc.) in methanol for 1 minute. The prepregs (2-ply) had a 61.0% polymer uptake and were 12.63 g in total weight. A laminate (2-ply) of the dimensions 6"×6" were obtained.

Results

Average peel strength at 180 degrees for 4 measurements was 8.2 lbs/in.

The boards passed the solder bath resistance test for 20 seconds at 260° C. and 288° C.

EXAMPLE 4

Example 3 was repeated except that in step 3 the silane/methanol solution was brushed onto the matte surface of the copper foil. The polymer uptake for the (2-ply) prepregs (2-ply) was about 60.5% at 12.47 g. Laminates (2-ply) of a 6"×6" dimension were obtained.

Results

Peel strength at 180 degrees=10.0 lbs/in.
Solder bath resistance for 20 seconds was not determined.

EXAMPLE 5

Example 3 was repeated except that in step 3 a single coat of the silane/methanol solution used in Example 3 was sprayed onto the matte surface of the copper foil. The prepregs (2-ply) had a 60.7% polymer uptake and was about 12.54 g. Laminates (2-ply) of a 6"×6" dimension were obtained.

Results

Peel strength at 180 degrees = 7.9 lbs/in.
Solder bath resistance for 20 seconds=passed at 260° C. and passed at 288° C.

EXAMPLE 6

Example 3 was repeated except that in step 3 three coats of the silane/methanol solution were sprayed onto the matte side of the copper foil. The copper was air dried after each coating. The prepregs (2-ply) weighed about 11.75 g and had a 57.4% polymer uptake. Laminates (2-ply) of the dimension 6"×6" were obtained. In forming the laminates, 1100 psi pressure was used.

Results

Peel strength at 180 degrees=6.0 lbs/in.
Solder bath resistance for 20 seconds=passed at 260° C.

EXAMPLE 7

Example 3 was repeated except that in step 3 a 1.2% silane/methanol solution was applied to the copper foil by dipping the copper foil in the solution for 30 minutes. The polymer uptake was 50.25%, 9.9 g for 2 plies of prepreg and the laminates obtained contained 2 plies at 6"×6".

Results

Peel strength at 180 degrees=5.5 lbs/in.
Solder bath resistance for 20 seconds=not determined.

EXAMPLE 8

Example was repeated except that in step 2 the prepregs were dipped twice in the dipping solution and dried as described in Example 1. The polymer uptake was 70.55% for the prepregs. A 2-ply laminate (6"×6") was formed weighing about 16.72 g. A 1.2% solution of silane in methanol was applied to the copper foil by dipping in the solution for 30 minutes.

Results

Peel strength at 100 degrees=5.4 lbs/in.
Solder bath resistance for 20 seconds=not determined.

EXAMPLE 9

Example 3 was repeated except that the copper foil was dipped once for 60 seconds in a 0.2% solution of the silane in methanol. The polymer uptake in the prepregs (2-ply) was 70.3% and the prepregs weighed 16.59 g. Laminates (2-ply, 6"×6") were obtained using 1000 psi pressure.

Results

Peel strength at 180 degrees=10.3 lb/in.
Solder bath resistance for 20 seconds=failed 260° C.

EXAMPLE 10

Example 9 was repeated except that the matte side of the copper foil was coated once with the silane/methanol solution by spraying. The polymer uptake in the prepregs (2-ply) was 70.1% providing a weight of 16.41 g. Laminates (2-ply) were obtained (6"×6") as described in Example 1.

Results

Peel strength at 180 degrees=10.2 lbs/in.
Solder bath resistance for 20 seconds=passed at 260° C., failed at 288° C.

EXAMPLE 11

Example 9 was repeated except that the matte side of the copper foil was sprayed once with a 2.0% solution of the silane in methanol. The polymer uptake in the prepregs (2-ply) was 60.3%, which weighed 12.41 g. Laminates (2-ply at 6"×6") were obtained using 1100 psi pressure.

Results

Peel strength at 180 degrees=2.6 lbs/in.
Solder bath resistance for 20 seconds=failed.

EXAMPLE 12

Example 1 was repeated except that the copper foil was pretreated with a silane solution prepared as follows. 8.8 g. of N-2-amino-ethyl-3-aminopropyltrimethoxysilane (a product of Petrarch Systems, Inc.) and 5.0 g. of benzyl chloride were charged in a reaction vessel to produce 3-(N-Benzyl-2-aminoethylamino)-propyltrimethoxysilane hydrochloride. A 1% solution of this silane in methanol was prepared, the copper foil dipped therein for 30 minutes followed by air drying and a 5-minute bake at 105° C. The copper foil was laminated to similar prepregs (2-ply, 6.12 g, 59.8% polymer uptake) as described in Example 1 and cured at 180° to 220° C. for 30 minutes under psi pressure. A 2-ply 3"×6" laminate was obtained.

Results

Peel strength at 180 degrees=5.6 lbs/in.
Solder bath resistance for 20 seconds=passed at 260° C. and passed at 288° C.

EXAMPLE 13

Example 1 was repeated except that the copper foil was pretreated with a silane solution prepared as follows. 6.66 grams of N-2-aminoethyl-3-aminopropyltrimethoxysilane (a product of Petrarch Systems Inc.) in 886 g of methanol were charged in a reaction vessel with 2.29 grams of allyl chloride to produce 3-(N-allyl-2-aminoethylamino)-propyltrimethoxysilane hydrochloride. A 1% solution of this silane in methanol was prepared as described in Example 12 and the copper foil dipped for 30 minutes. The copper foil and lamination were performed as described in Example 12 at a psi of 1100. The prepregs (2-ply) had a 62.45% polymer uptake and were formed into 6"×6" 2-ply laminates.

Results

Peel strength at 180 degrees=6.4 lbs/in.

Solder bath resistance for 20 seconds=passed at 260° C.

EXAMPLE 14

Example 1 was repeated except that the copper foil was pretreated by dipping for 22 minutes within a silane solution produced in-house. 4.42 grams of 3-aminopropyltriethoxysiane (from Petrarch Systems) were charged in a reaction vessel with 3.04 grams of a mixture of para and meta isomers of vinylbenzyl chloride (product of Dow Chemical Co.) in 1857.5 grams of methanol. The mixture was refluxed for 30 minutes and cooled to room temperature to produce N-(styrylmethyl)-3-aminopropyltrimethoxysilane hydrochloride. A 0.4% solution of this silane in methanol was prepared. The prepregs (2-ply) used hd a 68.99% polymer uptake and were formed into 2-ply, 6"×6" laminate as described in Example 1 at 180°-220° C. for 30 minutes, using a pressure of 1100 psi.

Results

Peel strength at 180 degrees=6.5 lbs/in.

Solder bath resistance for 20 seconds=passed at 288° C.

EXAMPLE 15

Example 1 was repeated except that the copper foil was pretreated with a 1% solution of N-2-aminoethyl-3-aminopropyltrimethoxysilane in methanol (from Petrarch Systems) which was applied to the copper foil by dipping. Laminates were obtained (2-ply, 3"×6") from prepregs weighing 6.15 g having 57.9% polymer uptake.

Results

Peel strength at 180 degrees=8.0 lbs/in. Solder bath resistance for 20 seconds=passed at 260° C. and passed at 288° C.

EXAMPLE 16

Example 1 was repeated except for the following changes.

In step 2 the concentration of Lupersol 130 peroxide was 0.6 phr.

In step 3 the copper foil was dipped once in a 0.4% solution of 3-(N-styrylmethyl-2-aminoethylamino)-propyltrimethoxy-silane HCl in methanol for 1 minute.

In step 4 lamination was performed at using a cold press from 40° C. to 190° C. over a 3 hour period.

Results

Peel strength at 180 degrees=9.0 lbs/in.

Solder bath resistance for 20 seconds=passed at 288° C.

EXAMPLE 17

Step 1

Preparation of 84/16 (wt/wt) Dicyclopentadiene (DCPD) Vinyl Norbornene (VNB) Copolymer A 84/16 (wt/wt) dicyclopentadiene/vinyl-norbornene was made by charging 527.9 grams of dry toluene in a reaction vessel with 90.5 grams of dicyclopentadiene, 17.3 g vinyl norbornene and 47.9 g of hexene-1 following the procedures of Step 1, Example 1. 1.7 cc of ethyl aluminum sesquichloride solution (25% dry toluene) and 6.0 cc of $MoCl_5$ solution (as described in Example 1) were introduced to start the reaction. The reaction exotherm subsided in about 10 minutes after which about 20 cc of 10% sodium hydroxide solution were added to the reaction vessel with agitation to stop the reaction.

500 cc of 88/12 (wt/wt) 2-propanol and water mixture were also added to the reaction vessel. The mixture was shaken and the top layer containing solvents, residual monomers and low molecular weight polymers was removed. The semisolid bottom layer containing the desired copolymer was redissolved in 100 cc of toluene and washed with water. Irganox 1010 antioxidant (1 phr) was added and the residual water was removed by azeotropic distillation. The solution appeared slightly opalescent. A DSC trace performed as in Example 1 showed Tg=118° C. In another example where the NaOH short stop was not used, the polymer precipitated and was insoluble in toluene.

Step 2

Preparation of Prepreg

The polymer solution was formulated with 1 phr of Lupersol 130 peroxide and was used as is.

An E-type glass cloth, style 2116 having a 642 finish was impregnated with the dipping solution which had a polymer uptake of 47.3% by weight. Pressing these prepregs into wiring boards into a double sided copper laminate was performed as in Example 3.

Results

Peel strength at 180 degrees=8.5 lbs/in.

Solder bath resistance for 20 seconds=passed at 288° C.

EXAMPLE 18

A glass cloth coated with 10% vinyl silane $C_3H_5$ $Si(OCH_3)_3$ in methanol and dried was used to make a laminate. The prepregs were obtained from dipping the glass cloth into a 25% toluene solution of 65/35 methyl tetracyclododecene/vinyl norbornene copolymer (Tg 118° C.). After room temperature drying and 30 minutes at 100° C. followed by 140° C. for 30 minutes, the prepregs were pressed between two copper (35 micron) sheets at 320° F. for 35-40 minutes. One side of the copper was as received. The other side was treated with a 10% methanol solution of

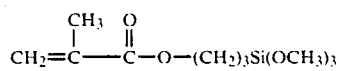

then air dried, followed by drying for 10 minutes at 100° C. before laminating. After pressing, the treated side could not be peeled off while the untreated copper was removed.

While this invention has been disclosed in this patent application by reference to the details of preferred embodiments of the invention, it is to be understood that this disclosure is intended in an illustrative rather than in a limiting sense, as it is contemplated that modifications will readily occur to those skilled in the art within the spirit of the invention and the scope of the appended claims.

What is claimed is:

1. A process for producing a laminate, comprising:
   (a) providing a polynorbornene dipping solution comprised of polynorbornene polymers within a solvent;
   (b) impregnating a non-cellulosic cloth with the dipping solution and drying said impregnated cloth to remove a substantial portion of solvent to form a substrate layer;
   (c) pretreating the surface of a copper film with a solution of a silane compound suitable for increasing the bond strength between the substrate layer and the copper layer; and
   (d) laminating the substrate layer to the metallic film across the pretreated copper layer.

2. A process as in claim 1 wherein the surface of the copper film which is pretreated has a bronze coating.

3. The process of claim 1 wherein the polynorbornene polymer is unsaturated and is derived from a cycloolefin monomer selected from methyltetracyclododecene, vinyl-norbornene and dicyclopentadiene.

4. The process of claim 1 wherein the monomers of the polynorbornene polymer are comprised in a weight to weight ratio of about 50–75 percent methyltetracyclododecene to 25–50 percent vinylnorbornene.

5. The process of claim 1 wherein the monomers of the polynorbornene polymer are comprised in weight to weight ratio of about 75–90 percent dicyclopentadiene to about 10–25 percent vinylnorbornene.

6. The process of claim 1 wherein the dipping solution further comprises a curing agent which initiates radical crosslinking.

7. The process of claim 1 wherein the silane is selected from the group consisting of
3-methylacryloxypropyltrimethoxysilane,
3-(N-styrylmethyl-2-aminoethylamino)propyltrimethoxysilane hydrochloride,
3-(N-allyl-2-aminoethylamno)-propyltrimethoxysilane hydrochloride,
N-(styrylmethyl)-3-aminopropyltrimethoxysilane hydrochloride,
N-2-aminoethyl-3-aminopropyltrimethoxysilane, and
3-(N-Benzyl-2-aminoethylamino)-propyltrimethoxy silane hydrochloride.

8. The process of claim 1 wherein the laminating step is performed at a temperature above the glass transition temperature of the polynorbornene.

9. The process of claim 1 wherein the laminating step is performed at between ambient temperature and about 250° C.

10. The process of claim 1 further comprising placing two or more substrate layers in a stacking sequence with copper layers at the outside of the stack.

11. The process of claim wherein the cloth is impregnated from 30% to 80% by weight polynorbornene polymer.

12. A printed wiring board made by the process of claim 1.

13. The printed wiring board of claim 12 wherein the non-cellulosic cloth is woven or non-woven fiberglass cloth.

14. The printed wiring board of claim 12 wherein the polynorbornene is derived from of vinyl-norbornene monomers polymerized with either methyltetracyclododecene or dicyclopentadiene monomers.

15. The printed wiring board of claim 12 wherein the dipping solution further comprises a curing agent which initiates radical crosslinking.

16. The printed wiring board of claim 12 wherein the dipping solution further comprises an antioxidant.

17. The printed wiring board of claim 12 wherein the copper film is the surface layer of a metallic film selected from the group consisting of copper, nickel, silver, gold, aluminum, platinum, titanium, zinc, bronze and chromium.

18. The printed wiring board of claim 12 wherein the silane suitable from increasing the bonding strength is selected from the group consisting of
3-methylacryloxypropyltrimethoxysilane,
3-(N-styrylmethyl-2-aminoethylamino)-propyltrimethoxysilane hydrochloride,
3-(N-allyl-2-aminoethylamino)-propyltrimethoxysilane hydrochloride,
N-(styrylmethyl)-3-aminopropyltrimethoxysilane hydrochloride,
N-2-aminoethyl-3-aminopropyltrimethoxysilane, and
3-(N-Benzyl-2-aminoethylamino)-propyl trimethoxysilane hydrochloride.

19. A printed wiring board of claim 12 wherein the non-cellulosic cloth is pretreated with a silane solution wherein the silane pretreating agent is selected from the class consisting of styryl diamino silanes.